(12) United States Patent
Oda

(10) Patent No.: US 6,492,264 B2
(45) Date of Patent: Dec. 10, 2002

(54) SEMICONDUCTOR DEVICE HAVING A SILICIDE LAYER WITH SILICON-RICH REGION AND METHOD FOR MAKING THE SAME

(75) Inventor: Noriaki Oda, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/921,882

(22) Filed: Aug. 6, 2001

(65) Prior Publication Data

US 2001/0049194 A1 Dec. 6, 2001

Related U.S. Application Data

(62) Division of application No. 09/241,599, filed on Feb. 2, 1999, now Pat. No. 6,288,430.

(30) Foreign Application Priority Data

Feb. 4, 1998 (JP) ............................................. 10-023304

(51) Int. Cl.[7] ......................................... H01L 21/4763
(52) U.S. Cl. ...................... 438/649; 438/655; 438/656; 438/664; 438/682
(58) Field of Search .................................. 438/108, 107, 438/106, 664, 649, 682, 655, 656

(56) References Cited

U.S. PATENT DOCUMENTS

| 4,443,930 A | 4/1984 | Hwang et al. | |
|---|---|---|---|
| 4,577,396 A | * 3/1986 | Yamamoto et al. | ........... 29/576 |
| 4,755,478 A | 7/1988 | Abernathey et al. | |

(List continued on next page.)

FOREIGN PATENT DOCUMENTS

| EP | 0634788 | 1/1995 |
|---|---|---|
| JP | 6445163 | 2/1989 |
| JP | 21120 | 1/1990 |
| JP | 2211623 | 8/1990 |
| JP | 483342 | 3/1992 |
| JP | 4299825 | 10/1992 |
| JP | 7153950 | 6/1995 |
| JP | 7245277 | 9/1995 |
| JP | 7283168 | 10/1995 |
| JP | 8274047 | 10/1996 |
| JP | 9115860 | 5/1997 |
| JP | 10242081 | 9/1998 |
| WO | WO8203948 | 11/1982 |

OTHER PUBLICATIONS

Ping Liu et al., "Growth of epitaxial $CoSi_2$ film on Si (100) substrate induced by an interfacial Ti layer", Materials Letters, vol. 17, No. 16, Oct. 1993, pp. 383–387.

H. Kawaguchi et al., "A Robust 0.15$\mu$m CMOS Technology with $CoSi_2$ Salicide and Shallow Trench Isolation", Symposium on VLSI Technology Digest of Technical Papers, 1997, pp. 125–126.

Primary Examiner—Carl Whitehead, Jr.
Assistant Examiner—Volita Russell
(74) Attorney, Agent, or Firm—Young & Thompson

(57) ABSTRACT

A semiconductor device includes a substrate; a semiconductor region formed on the substrate; and a silicide layer as a contact layer formed directly contacting the semiconductor region; wherein the silicide layer is made to be rich in silicon while including such a silicon amount that contact resistance is significantly lowered and a method for making a semiconductor device which has the steps of: forming selectively a given conductive type semiconductor region on a substrate; forming a Co—Si alloy layer on the entire surface of the semiconductor region; introducing Si into the entire surface or part of the Co—Si alloy layer; and conducting the thermal treatment of the substrate to react the introduced Si with the Co—Si alloy layer and the Ti-included layer to form a Si-rich silicide layer including such a silicon amount that contact resistance is significantly lowered.

5 Claims, 12 Drawing Sheets

U.S. PATENT DOCUMENTS

| | | |
|---|---|---|
| 4,926,237 A | 5/1990 | Sun et al. |
| 5,086,017 A * | 2/1992 | Lu .............................. 438/655 |
| 5,217,923 A * | 6/1993 | Sunguro ...................... 438/305 |
| 5,322,809 A | 6/1994 | Moslehi |
| 5,529,958 A | 6/1996 | Yaoita |
| 5,541,131 A | 7/1996 | Yoo et al. |
| 5,619,057 A | 4/1997 | Komatsu |
| 5,691,225 A | 11/1997 | Abiko |
| 5,710,438 A | 1/1998 | Oda et al. |
| 5,851,921 A | 12/1998 | Gardner et al. |
| 5,981,372 A * | 11/1999 | Goto et al. .................. 438/621 |
| 6,022,801 A * | 2/2000 | Domenicucci et al. ....... 438/653 |
| 6,051,494 A * | 11/2000 | Iwamatsu et al. ........... 438/683 |
| 6,323,130 B1 * | 11/2001 | Brodsky et al. ............ 438/682 |

* cited by examiner

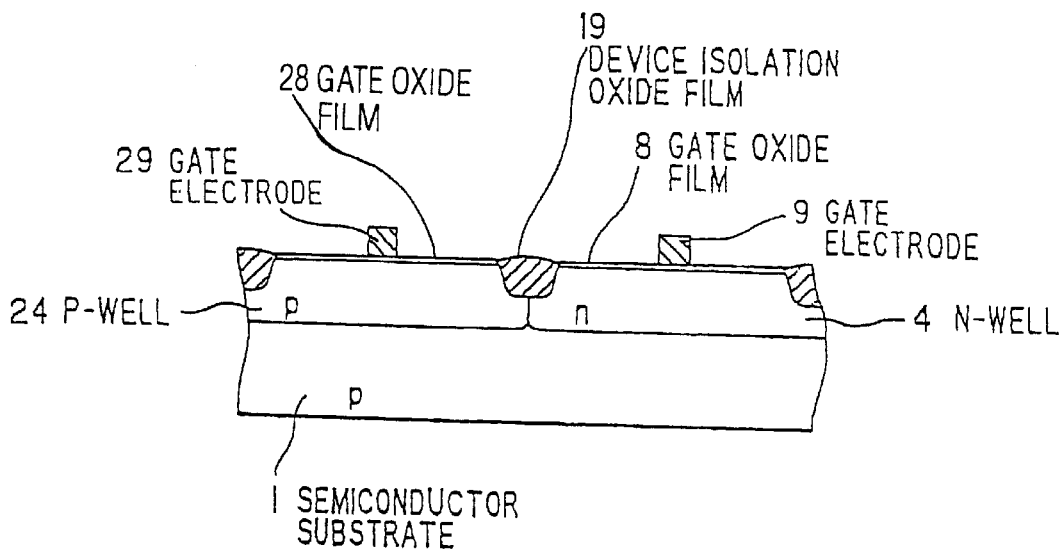
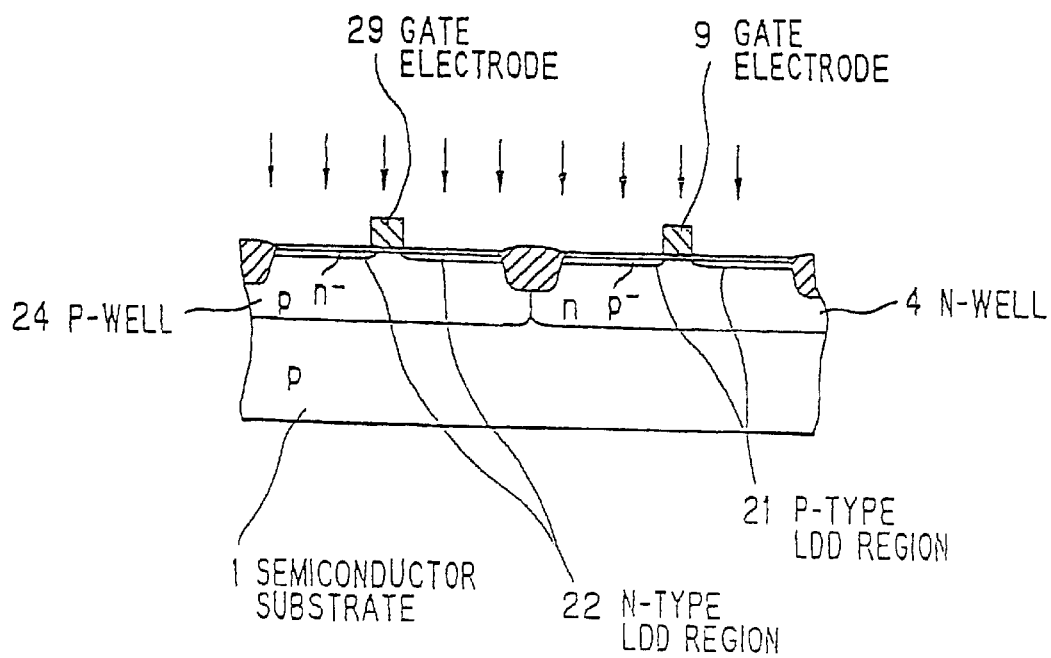

US 6,492,264 B2

SEMICONDUCTOR DEVICE HAVING A SILICIDE LAYER WITH SILICON-RICH REGION AND METHOD FOR MAKING THE SAME

This is a division of application Ser. No. 09/241,599, filed Feb. 2, 1999, now U.S. Pat. No. 6,288,430.

FIELD OF THE INVENTION

This invention relates to a semiconductor device, and more particularly to, a semiconductor device that uses a layer of silicide, which is an intermetallic compound of silicon and metals, as the contact layer which directly contacts a semiconductor region such as source and drain, and also relates to a method for making the semiconductor device.

BACKGROUND OF THE INVENTION

In memories and LSI(large-scale integrated circuit) such as a microprocessor, which are known as the representative of semiconductor devices, the dimensions of device have been increasingly fine-structured with an increase in integration density. Also, the semiconductor region to compose the device has been formed shallower. Further, when forming a contact in semiconductor region, the size of contact hole to be formed in interlayer dielectric film has been also limited.

For example, in recent LSI that is composed of MOS (metal oxide semiconductor), when forming a contact in semiconductor region composed of a source region and a drain region, the size of the contact hole to be formed in the interlayer dielectric film is designed to be a fine value of less than 0.4 μm (in diameter). As the contact hole is fine-structured like this, the kind of materials for upper wiring layer that can be formed well-adhesive to the contact hole is limited. Tungsten (W) is known as one of the excellent wiring materials applicable to such object.

Here, when forming a contact in semiconductor region, if a wiring material of tungsten is adhered directly to the semiconductor region, the contact characteristic is deteriorated due to the reaction of the semiconductor region and tungsten. To prevent this, a high-melting-point metal layer to function as the barrier layer has been laid between them. As the high-melting-point metal layer, a two-layer film of Ti/TiN with excellent barrier performance is generally used. Ti (titanium) is formed on the semiconductor region side and TiN (nitride-titanium) is formed on the tungsten side. Tungsten has a characteristic easy to adhere to TiN.

Also, in the case of forming a contact in a shallow semiconductor region, an increase in contact resistance becomes an issue. It is known that to form a silicide layer such as Co—Si alloy ($CoSi_2$), a silicide compound, on the surface of the semiconductor region is effective in restraining the contact resistance from increasing.

Problems occurred when the contact resistance increases are explained below. FIG. 1 is an illustrative cross sectional view showing the electrode part of a MOS transistor composing LSI. In FIG. 1, 101 is a Si substrate, 102 is a source region, 104 is a channel region, 105 is a gate oxide film, 106 is a sidewall oxide film, 107 is a gate electrode, 108 is an interlayer dielectric film, 109 is a contact hole, 110 is a barrier layer compose of two-layer film of Ti/TiN, 111 is a wiring layer of tungsten, and 112 is an upper wiring layer of Al-system metal.

Here, the resistance parasitic to the current path when the MOS transistor is turned on is classified into components listed below.

Rc: resistance inside the contact hole (in this case, a resistivity of tungsten, which is reversely proportional to the square of the diameter of contact hole)

Rx: contact resistance of the barrier layer and the silicide layer (reversely proportional to the square of the diameter of contact hole)

Rs: resistance of the silicide layer

Rms: contact resistance of the silicide layer and the source/drain region

Rch: channel resistance

The total resistance Rt when the MOS transistor is turned on is given by expression 1:

$$Rt=2Rc+2Rx+2Rs+2Rms+Rch \quad [1]$$

The contact resistance Rco is given by expression 2:

$$Rco=Rc+Rx \quad [2]$$

In FIG. 1, as the dimensions of the MOS transistor decrease with an increase in integration density of LSI, especially Rx abruptly increases in reverse proportion to the square of the diameter of contact hole, and therefore the contact resistance Rco increases based on expression 2. Along with this, the total resistance Rt increases based on expression 1 and thereby on-current decreases. Therefore, a problem occurs in that the operation speed of the entire LSI is lowered. This is because the amount of electric charge supplied to the next-stage element (transistor) decreases due to the decrease in on-current.

Semiconductor devices where a silicide layer composed of Co—Si alloy layer is formed in its semiconductor region so as to restrain the contact resistance from increasing are, for example, disclosed in Japanese patent application laid-open No.7-78788 (1995), and H. Kawaguchi et al., "A Robust 0.15 μm CMOS Technology with $CoSi_2$ Salicide and Shallow Trench Isolation", 1997 Symposium on VLSI Technology Digest of Technical Papers 9B-4 (1997) pp.125–126.

FIG. 2 shows an example of semiconductor device described in Japanese patent application laid-open No.7-78788. Between a lower conductor region 202 as source/drain region formed in a semiconductor substrate 200 and an upper wiring layer 206 formed on insulating layers 204A, 204B on a gate electrode 220 to cover the lower conductor region 202, there is provided electrical connection through a connection hole (intermediate conductor layer) 208. The connection hole 208 is composed of a monocrystal $CoSi_2$ (Co—Si alloy) layer 210 formed on the surface of the lower conductor region 202, a tungsten layer 214 as a wiring material deposited (buried) in a contact hole 212 formed in the insulating layers 204A, 204B, and a monocrystal TiN layer 216 formed between the layers 210 and 214. Here, the monocrystal TiN layer 216 functions as a barrier layer to control the reaction of the lower conductor region 202 and the tungsten layer 214. Under the upper wiring layer 206, there is formed a barrier layer 218 of two-layer film of Ti, TiON from below.

However, in the conventional technique described in Japanese patent application laid-open No.7-78788, there is a problem that the silicide layer of Co—Si alloy layer used as the contact layer does not sufficiently play a role to suppress an increase in contact resistance (Rx). This is because the Si content of the Co—Si alloy layer or a Co—Si—Ti alloy layer to be formed through the reaction of the Co—Si alloy layer and Ti as the component of the barrier layer formed on the Co—Si alloy layer is small.

SUMMARY OF THE INVENTION

Accordingly, it is an object of the invention to provide a semiconductor device that the contact resistance of silicide layer used as a contact layer can be sufficiently restrained from increasing, thereby restraining the on-current from reducing and enhancing the operation speed.

It is an object of the invention to provide a method for making such a semiconductor device.

According to the invention, a semiconductor device, comprising:

a substrate;

a semiconductor region formed on the substrate; and a silicide layer as a contact layer formed directly contacting the semiconductor region;

wherein the silicide layer is made to be rich in silicon while including such a silicon amount that contact resistance is significantly lowered.

According to another aspect of the invention, a method for making a semiconductor device, comprising the steps of:

forming selectively a given conductive type semiconductor region on a substrate;

forming a Co—Si alloy layer on the entire surface of the semiconductor region;

introducing Si into the entire surface or part of the Co—Si alloy layer;

forming a Ti-included layer in part of the Co—Si alloy layer; and conducting the thermal treatment of the substrate to react the introduced Si with the Co—Si alloy layer and the Ti-included layer to form a Si-rich silicide layer including such a silicon amount that contact resistance is significantly lowered.

BRIEF DESCRIPTION OF THE DRAWINGS

The invention will be explained in more detail in conjunction with the appended drawings, wherein:

FIGS. 6 to 16 are cross sectional views showing a method for making the semiconductor device in a second preferred embodiment according to the invention.

DESCRIPTION OF THE PREFERRED EMBODIMENTS

Figure 1:
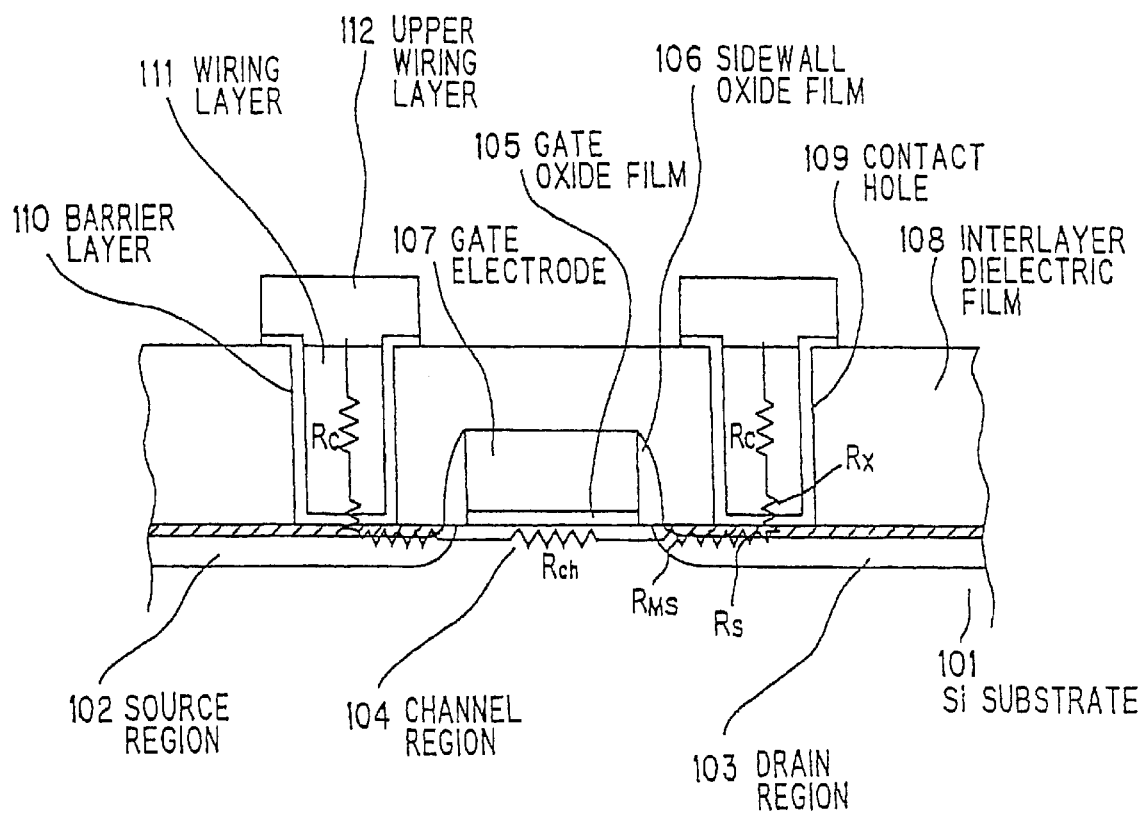
FIG. 1 is an illustrative cross sectional view showing a conventional semiconductor device for explaining a problem occurring when the contact resistance increases.
Figure 2:
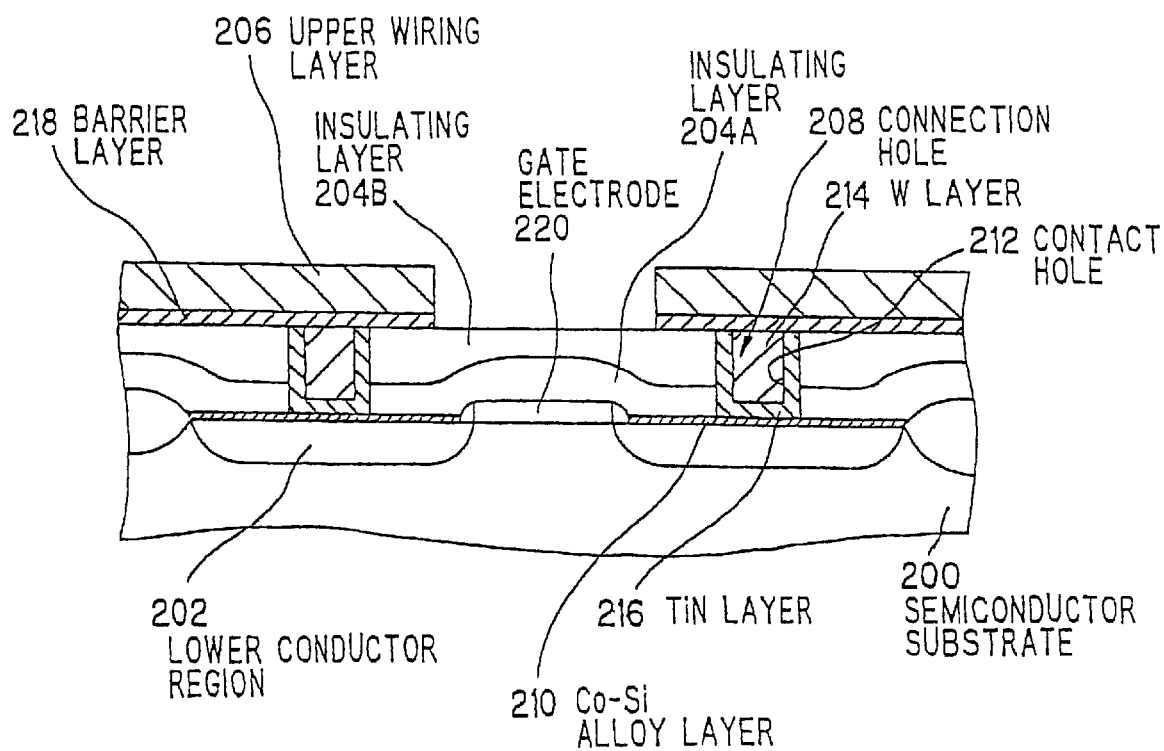
FIG. 2 is a cross sectional view showing another conventional semiconductor device.

The preferred embodiments of the invention will be explained below, referring to the drawings. The explanations are concretely made using the embodiments.

Embodiment 1

Figure 3:
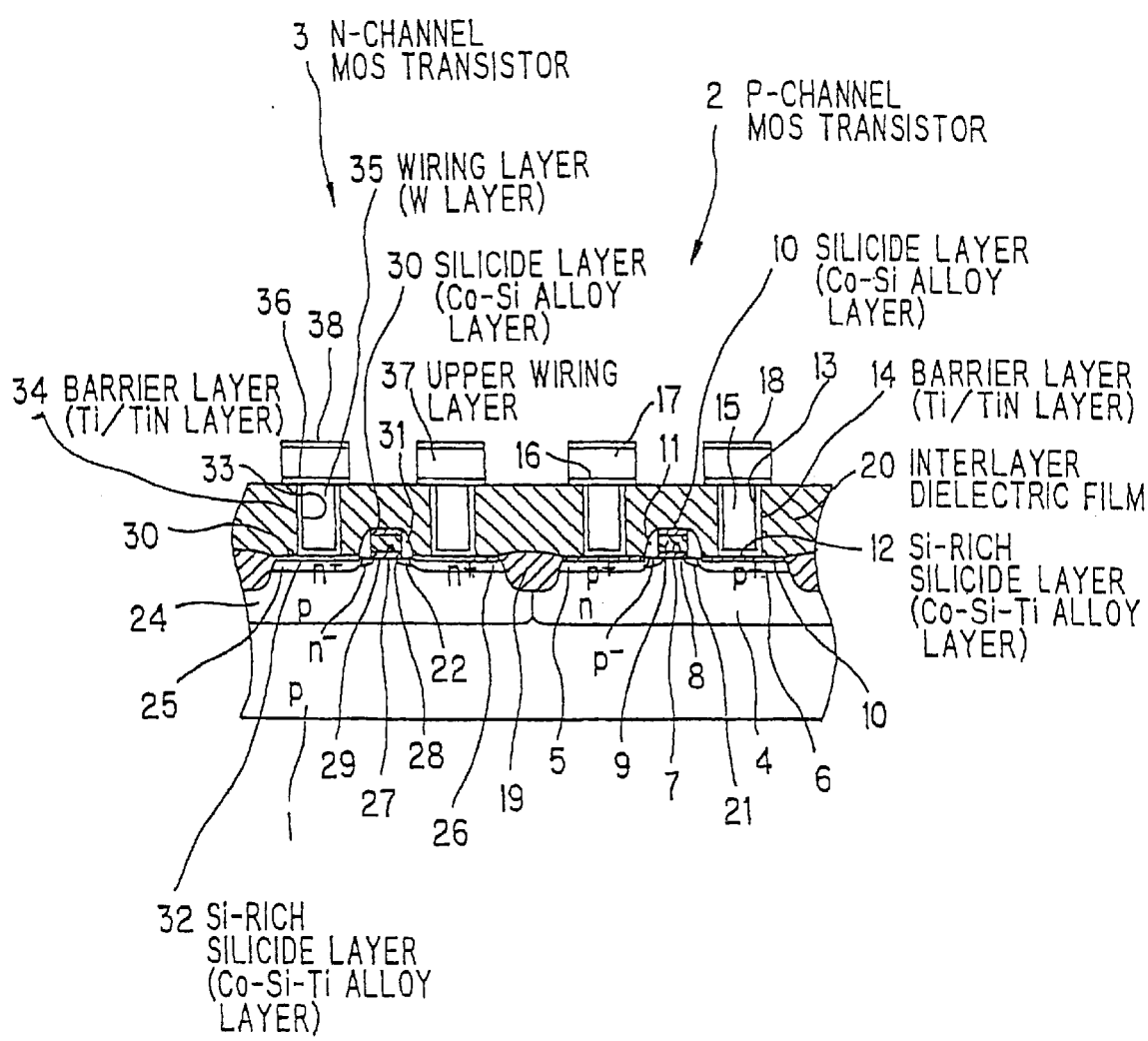
FIG. 3 is a cross sectional view showing a semiconductor device in a first preferred embodiment according to the invention.

FIG. 3 is a cross sectional view showing a semiconductor device in the first preferred embodiment of the invention.

The semiconductor device in this embodiment, as shown in FIG. 3, relates to a semiconductor device with a complementary MOS IC composition. It is composed of a p-channel type MOS transistor 2 and a n-channel type MOS transistor 3 that are formed on a semiconductor substrate 1 of p-type monocrystal silicon through a device isolation oxide film 19, and an interlayer dielectric film 20 to cover the surface of the transistors 2, 3.

In the p-channel type MOS transistor 2, a $p^+$-type source region 5 and a $p^+$-type drain region 6 are formed in an n-type well 4 formed on the semiconductor substrate 1, and a gate electrode 9 of polycrystal Si with a thickness of 100 to 300 nm is formed on the surface of a channel region 7 between the regions 5, 6 through a gate oxide film 8 of 2 to 5 nm thick. On the gate electrode 9, a silicide layer 10 of Co—Si alloy layer is formed. The side of the gate electrode 9 is covered with sidewall oxide film 11 of 50 to 200 nm thick. A $p^+$-type LDD (lightly doped drain) region 21 is formed adjacent to the $p^+$-type source region 5 and the $p^+$-type drain region 6.

On the entire surface of the $p^+$-type source region 5 and the $p^+$-type drain region 6, the silicide layer 10 of Co—Si alloy layer is formed, and a Si-rich silicide layer 12 of Co—Si—Ti alloy layer is selectively formed in the silicide layer 10. The Si-rich silicide layer 12 is made to be rich in Si while including such a Si amount that the contact resistance is significantly lowered.

At the region where the silicide layer 12 is formed in the interlayer dielectric film 20, a contact hole 13 is formed. On the side and bottom of the contact hole 13, a two-layer barrier layer 14 of Ti (of about 50 nm thick)/TiN (of about 50 nm thick), where the Ti layer is located on the silicide layer 12 side, is formed to connect with the silicide layer 12. Also, a wiring layer 15 of tungsten is formed in the contact hole 13 to connect with the barrier layer 14.

On the wiring layer 15, a barrier layer 16 of TiN (with a thickness of about 50 nm) is formed to connect with the barrier layer 14, and an upper wiring layer 17 of AlCu etc. is formed on the barrier layer 16. On the upper wiring layer 17, an anti-reflective coating 18 of TiN with a thickness of 200 to 500 nm is formed. The anti-reflective coating 18, which is necessary for a stage of the manufacturing process, is finally left as it is.

On the other hand, in the n-channel type MOS transistor 3, a $n^+$-type source region 25 and a $n^+$-type drain region 26 are formed in a $p^+$-type well 24 formed on the semiconductor substrate 1, and a gate electrode 29 of polycrystal Si with a thickness of 100 to 300 nm is formed on the surface of a channel region 27 between the regions 25, 26 through a gate oxide film 28 of 2 to 5 nm thick. On the gate electrode 29, a silicide layer 30 of Co—Si alloy layer is formed. The side of the gate electrode 29 is covered with sidewall oxide film 31 of 50 to 200 nm thick. A $n^-$-type LDD region 22 is formed adjacent to the $n^+$-type source region 25 and the $n^+$-type drain region 26.

On the entire surface of the $n^+$-type source region 25 and the $n^+$-type drain region 26, the silicide layer 30 of Co—Si alloy layer is formed, and a Si-rich silicide layer 32 of Co—Si—Ti alloy layer is selectively formed in the silicide layer 30. The Si-rich silicide layer 32 is made to be rich in Si while including such a Si amount that the contact resistance is significantly lowered.

At the region where the silicide layer 32 is formed in the interlayer dielectric film 20, a contact hole 33 is formed. On the side and bottom of the contact hole 33, a two-layer barrier layer 34 of Ti (of about 50 nm thick)/TiN (of about 50 nm thick), where the Ti layer is located on the silicide layer 32 side, is formed to connect with the silicide layer 32. Also, a wiring layer 35 of tungsten is formed in the contact hole 33 to connect with the barrier layer 34.

On the wiring layer 35, a barrier layer 36 of TiN (with a thickness of about 50 nm) is formed to connect with the barrier layer 34, and an upper wiring layer 37 of AlCu etc. is formed on the barrier layer 36. On the upper wiring layer 37, an anti-reflective coating 38 of TiN with a thickness of 200 to 500 nm is formed. The anti-reflective coating 38, which is necessary for a photolithography stage of the manufacturing process, is finally left as it is.

When the Si-rich silicide layer 12 of the p-channel type MOS transistor 2 and the Si-rich silicide layer 32 of the n-channel type MOS transistor 3 are formed in the contact hole with a diameter of about 0.2 $\mu$m, Si with a dose amount of about $5\times10^{15}$ cm$^{-2}$ is included in the Si-rich silicide layers 12, 32.

Figure 4:
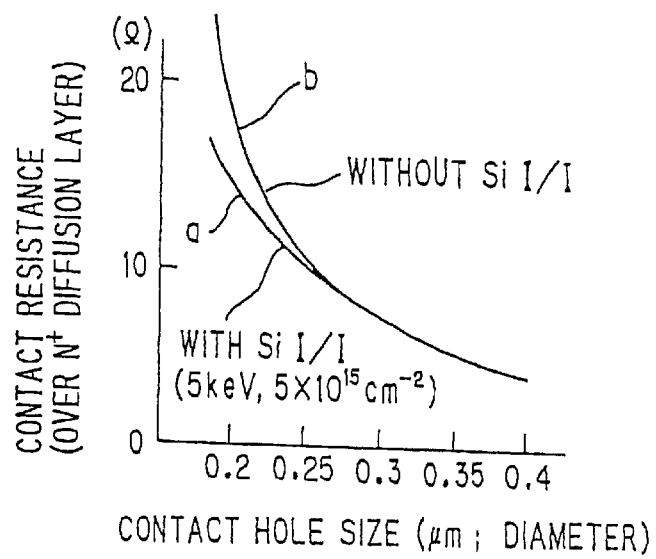
FIG. 4 is a characteristic diagram showing the reduction effect of contact resistance of the semiconductor device in the first embodiment.

FIG. 4 is a characteristic diagram showing the reduction effect of contact resistance due to the Si-rich silicide layer 32 that is formed in the n$^+$-type source region 25 and the n$^+$-type drain region 26 of the n-channel type MOS transistor 3. The vertical axis indicates contact resistance on the regions 25, 26 and the horizontal axis indicates contact hole sizes (diameter, $\mu$m). In FIG. 4, curve a represents a characteristic obtained when the Si-rich silicide layer 32 is formed, and curve b represents a characteristic obtained when the Si-rich silicide layer 32 is not formed. Meanwhile, curve a represents the case that the ion-implantation (I/I) of Si is conducted on the conditions of acceleration energy of 5keV and dose amount of $5\times10^{15}$ cm$^{-2}$ so as to make it to be rich in Si.

Figure 5:
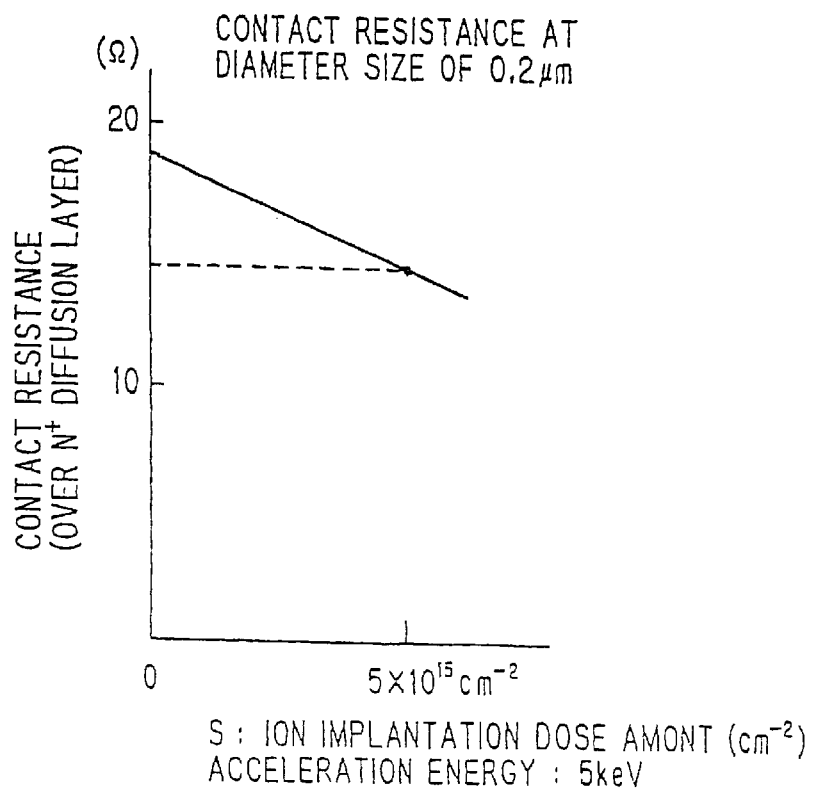
FIG. 5 is a characteristic diagram showing the reduction effect of contact resistance of the semiconductor device in the first embodiment.

FIG. 5 is a characteristic diagram obtained, based on the characteristic diagram in FIG. 4, when the contact hole size is specified to have a diameter of about 0.2 $\mu$m, where the vertical axis indicates contact resistance and the horizontal axis indicates the conditions of ion-implantation (acceleration energy and dose amount) Apparent from FIGS. 4 and 5, by ion-implanting Si to a contact hole with a diameter of about 0.2 $\mu$m with a dose amount of about $5\times10^{15}$ cm$^{-2}$ to form the Si-rich silicide layer, the contact resistance can be reduced to 15 to 17$\Omega$.

Also, apparent from FIG. 4, even when the contact hole size is fine-structured to have a diameter less than about 0.27 $\mu$m, the contact resistance can be significantly reduced by forming the Si-rich silicide layer by the method in this embodiment.

Although the characteristic diagrams in FIGS. 4 and 5 are shown for the example that the Si-rich silicide layer 32 that is formed in the n$^+$-type source region 25 and n$^+$-type drain region 26 of the n-channel type MOS transistor 3, the contact resistance can be similarly reduced when the Si-rich silicide layer 12 that is formed in the p$^+$-type source region 5 and p$^+$-type drain region 6 of the p-channel type MOS transistor 2.

As described above, in this embodiment, the Si-rich silicide layers 12, 32 of Co—Si—Ti alloy layer each are formed in the p$^+$-type source region 5 and ps-type drain region 6 of the p-channel type MOS transistor 2, and in the n$^+$-type source region 25 and n$^+$-type drain region 26 of the n-channel type MOS transistor 3. Thereby, the amount of Si included in the respective silicide layers 12, 32 can be made rich. Therefore, the respective silicide layers 12, 32 can sufficiently play a role to suppress an increase in contact resistance.

Accordingly, the contact resistance of the silicide layer used as a contact layer can be restrained from increasing, and therefore the on-current can be prevented from reducing. As a result, the operation speed of the semiconductor device can be enhanced.

Embodiment 2

FIGS. 6 to 16 are cross sectional views showing, in the order of processes, a method of making a semiconductor device in the second preferred embodiment of the invention. For the semiconductor device in the first embodiment, the method in the second embodiment is explained below in the order of the processes.

Figure 6:
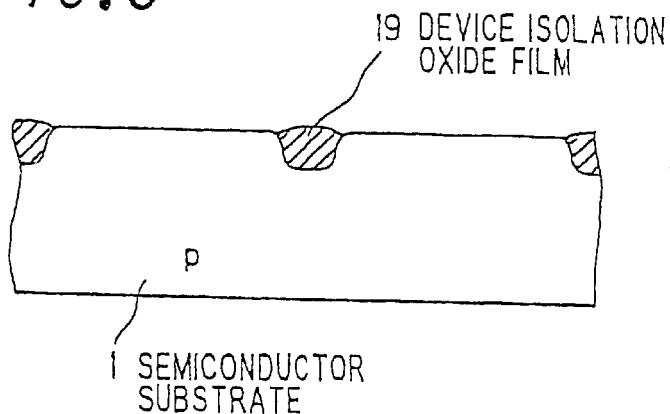
Figure 7:
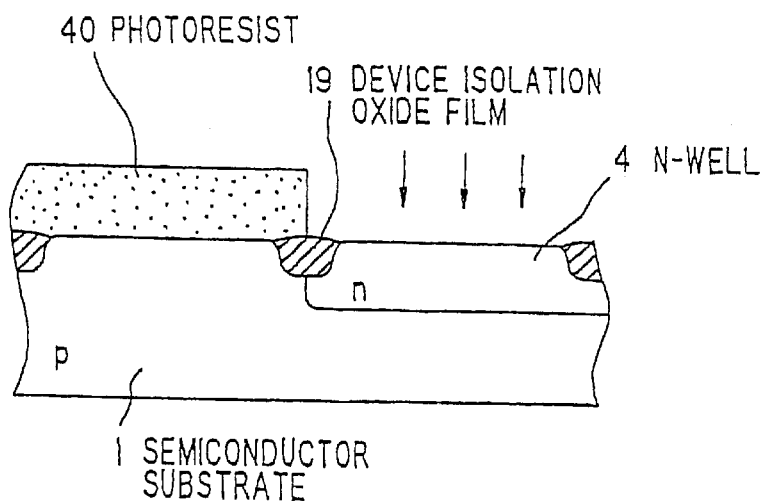
Figure 8:
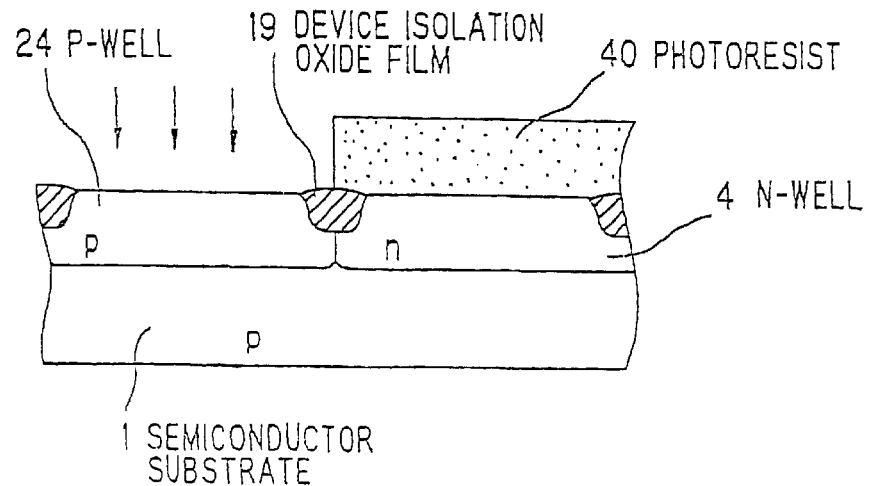

First, as shown in FIG. 6, by using the semiconductor substrate 1 of p-type monocrystal silicon and applying a well-known partial oxidation technique to that, the device isolation oxide film 19 to isolate regions for forming MOS transistors is formed. Then, as shown in FIG. 7, while masking the region for forming the n-channel type MOS transistor on the semiconductor substrate 1 by photoresist 40, a n-type impurity such as phosphor (P) and arsenic (As) is, as shown by arrows, ion-implanted into the region for forming the p-channel type MOS transistor, thereby forming the n-type well 4. Then, as shown in FIG. 8, while masking the region for forming the p-channel type MOS transistor on the semiconductor substrate 1 by photoresist 40, a p-type impurity such as boron (B) is, as shown by arrows, ion-implanted into the region for forming the n-channel type MOS transistor, thereby forming the p-type well 24.

Then, as shown in FIG. 9, by conducting the thermal oxidation of the semiconductor substrate 1, the gate oxide film 8, 28 of 2 to 5 nm thick is formed in the region enclosed by the device isolation oxide film 19. Then, polycrystal Si film of 100 to 300 nm thick is formed on the gate oxide film 8, 28 by CVD (chemical vapor deposition), and then the gate electrodes 9, 29 are formed by removing unnecessary part by photolithography.

Then, as shown in FIG. 10, using an impurity source such as BF$_2$, boron is ion-implanted, as shown by arrows, into the region for forming the p-channel type MOS transistor on the semiconductor substrate 1 on the conditions of acceleration energy of 3 to 7 keV and dose amount of $5\times10^{13}$ to $1\times10^{14}$ cm$^{-2}$, thereby forming the p$^-$-type LDD region 21 in the n-type well 4.

Then, arsenic is ion-implanted, as shown by the arrows, into the region for forming the n-channel type MOS transistor on the semiconductor substrate 1 on the conditions of acceleration energy of 10 to 20 keV and dose amount of $1\times10^{14}$ to $1\times10^{15}$ cm$^{-2}$, thereby forming the n$^-$-type LDD region 22 in the p-type well 24. These p$^-$-type LDD region 21 and n$^-$-type LDD region 22 can be sequentially formed in two steps by using the photoresist mask 40 described earlier.

Figure 11:
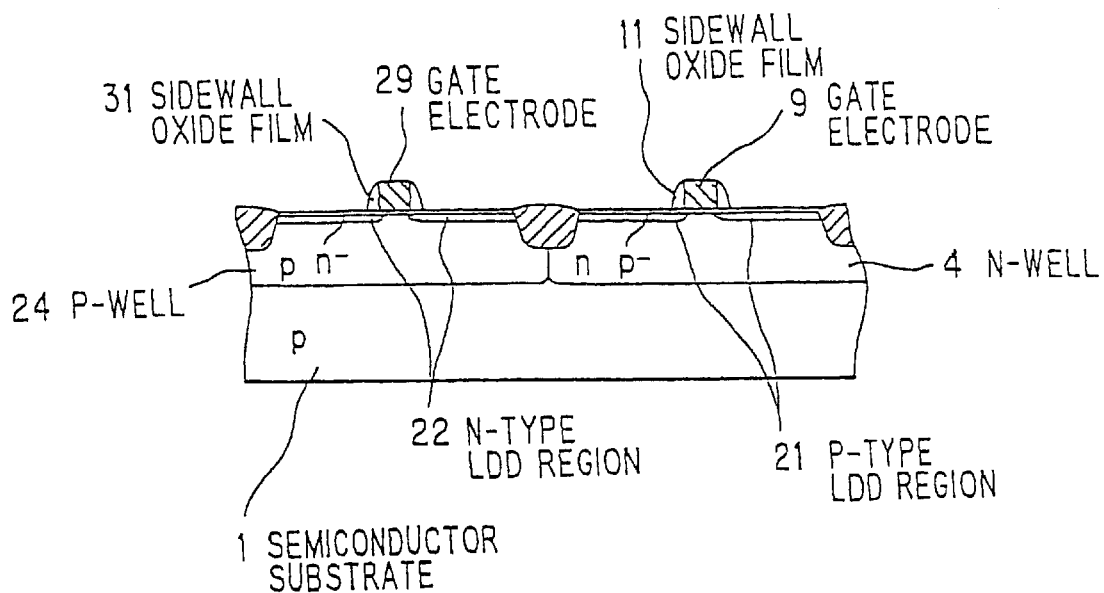

Then, as shown in FIG. 11, oxide film of 50 to 200 nm thick is formed on the semiconductor substrate 1 by CVD, then removing unnecessary part by etch back, forming the sidewall oxide films 11, 31 on the side of the gate electrodes 9, 29.

Figure 12:
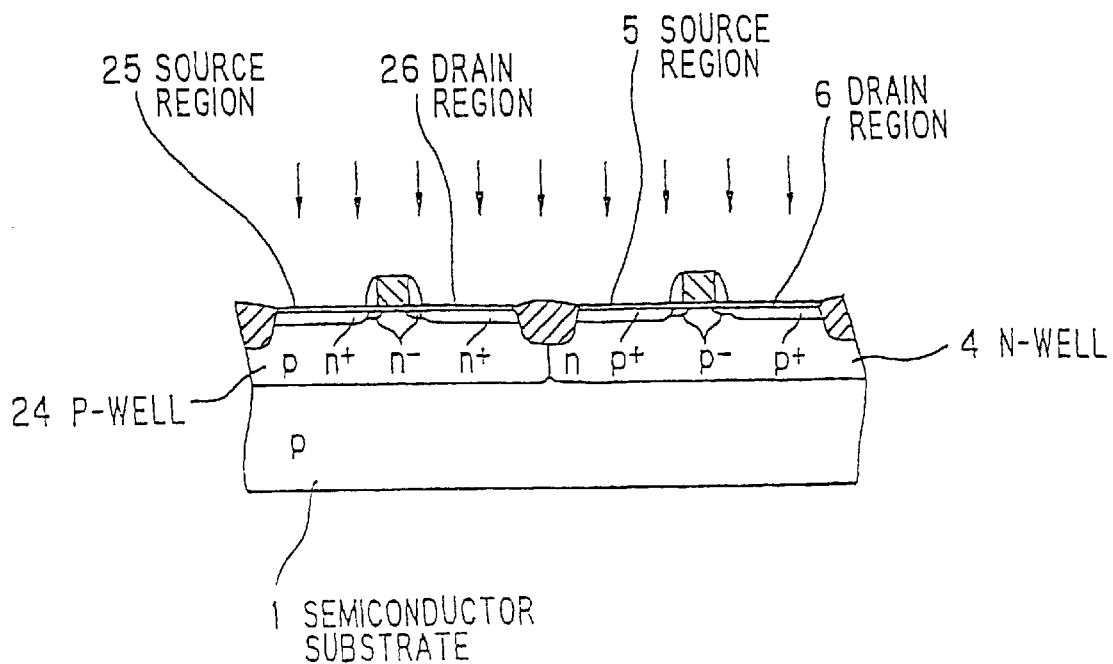

Then, as shown in FIG. 12, using an impurity source such as BF$_2$, boron is ion-implanted, as shown by arrows, into the region for forming the p-channel type MOS transistor on the conditions of acceleration energy of 10 to 40 keV and dose amount of $1\times10^{15}$ to $6\times10^5$ cm$^{-2}$. Then, arsenic is ion-implanted, as shown by the arrows, into the region for forming the n-channel type MOS transistor on the conditions of acceleration energy of 20 to 70 keV and dose amount of $1\times10^{15}$ to $6\times10^{15}$ cm$^{-2}$. Then, the semiconductor substrate 1 is annealed at 900 to 1100° C. for 5 to 30 sec. in $N_2$ atmosphere to raise the expansion-diffusing of boron and arsenic ion-implanted as described above, thereby forming the p$^+$-type source region 5 and p$^+$-type drain region 6, and the n$^+$-type source region 25 and n$^+$-type drain region 26.

Figure 13:
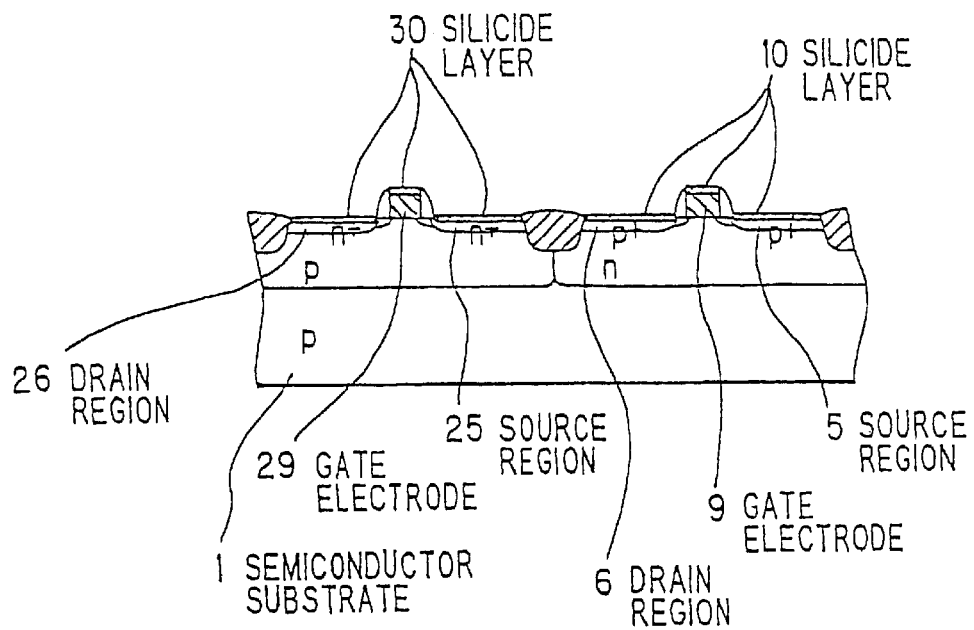

Then, as shown in FIG. 13, on the entire surface of the p$^+$-type source region 5 and p$^+$-type drain region 6, and on the entire surface of the n$^+$-type source region 25 and n$^+$-type drain region 26, further on the gate electrodes 9, 29, the silicide layers 10, 30 of Co—Si layer are formed. In detail, first, the semiconductor substrate 1 is pretreated with hydrofluoric acid, then forming Co of 5 to 20 nm thick on the entire surface by sputtering. Then, by annealing at 600 to 700° C. for 10 to 60 sec. in $N_2$ atmosphere, Co reacts with Si and, thereby, the silicide layers 10, 30 of Co—Si alloy layer are formed. Then, the semiconductor substrate 1 is treated with a mixed solution of $H_2SO_4$ (sulfuric acid) and $H_2O_2$ (hydrogen peroxide) to remove excessive Co, then annealing at 750 to 900° C. for 5 to 20 sec. in $N_2$ atmosphere again, thereby forming the complete silicide layers 10, 30 of Co—Si alloy layer.

Figure 14:
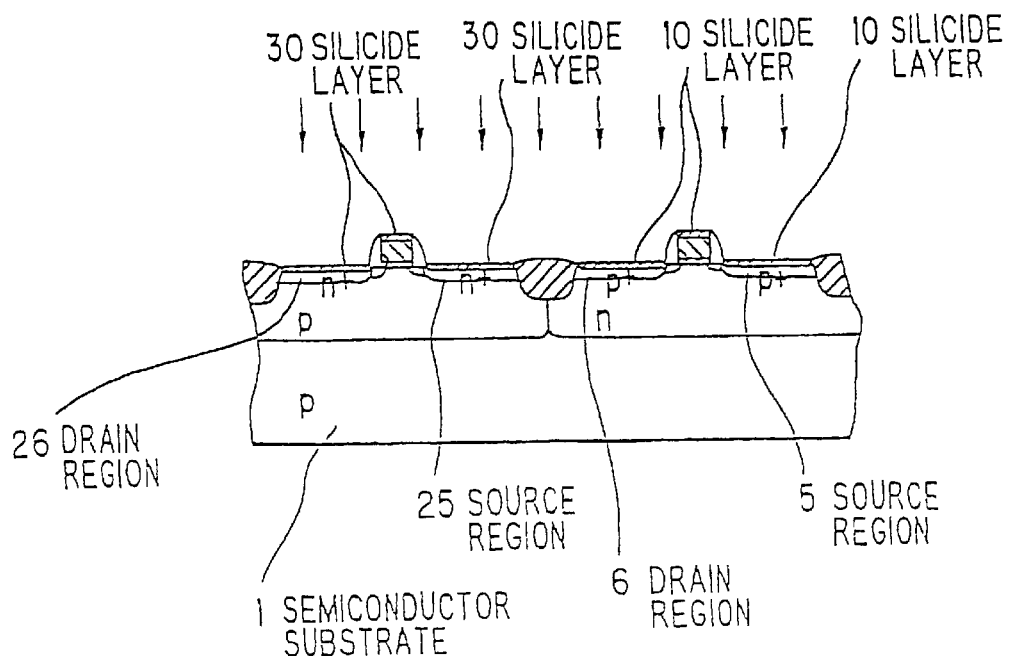
Figure 15:
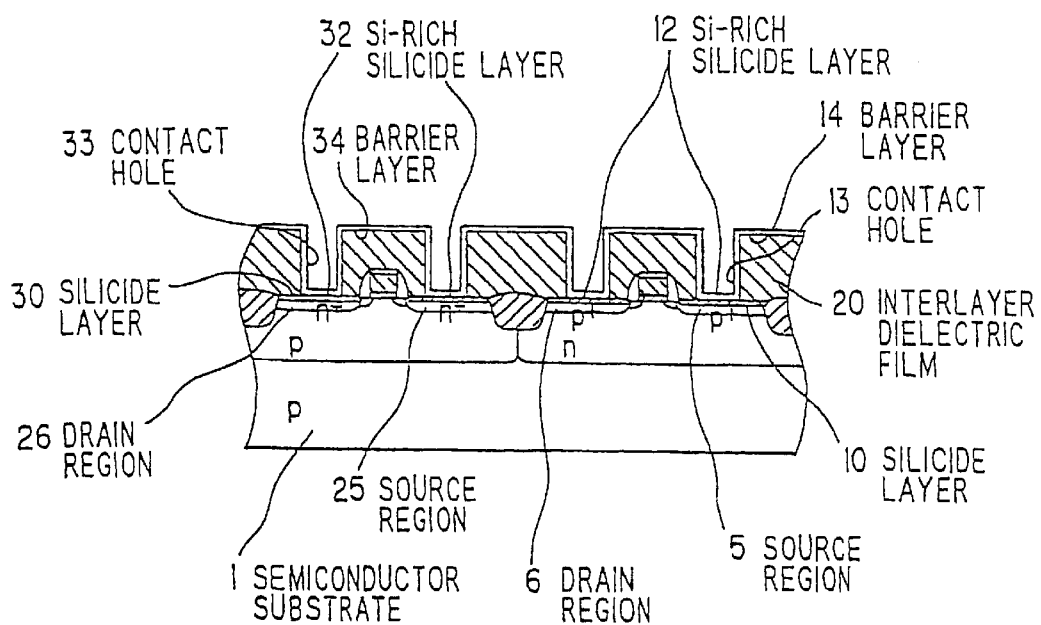

Then, as shown in FIG. 14, Si is ion-implanted, as shown by arrows, to the entire surface of the semiconductor substrate 1 on the conditions of acceleration energy of 1 to 20 keV and dose amount of $5\times10^{14}$ to $7\times10^{15}$ cm$^{-2}$.

Then, at part of the silicide layer 10 of Co—Si alloy layer on the entire surface of the p$^+$-type source region 5 and p$^+$-type drain region 6, and at part of the silicide layer 10 of Co—Si alloy layer on the entire surface of the n -type source region 25 and n$^+$-type drain region 26, the Si-rich silicide layers 12, 32 of Co—Si—Ti alloy layer are formed. In detail, first, the interlayer dielectric film 20 is formed on the entire surface of the semiconductor substrate 1 by CVD, and then part of the film is removed by photolithography to expose part of the silicide layers 10, 30 to open the contact holes 13, 33. Then, Ti of about 500Å thick and TiN of about 500Å thick are sequentially formed on the interlayer dielectric film 20 including the contact holes 13, 33 by sputtering, thereby forming the two-layer barrier layers 14, 34 of Ti/TiN, where Ti is located downside. Then, by annealing at 650 to 850° C. for 10 to 60 sec. in $N_2$ atmosphere, Si, which is ion-implanted as described earlier, reacts with Ti of the silicide layers 10, 30 of Co—Si alloy layer and of the two-layer barrier layers 14, 34 of Ti/TiN and, thereby, the silicide layers 12, 32 of Co—Si—Ti alloy layer are formed.

Figure 16:
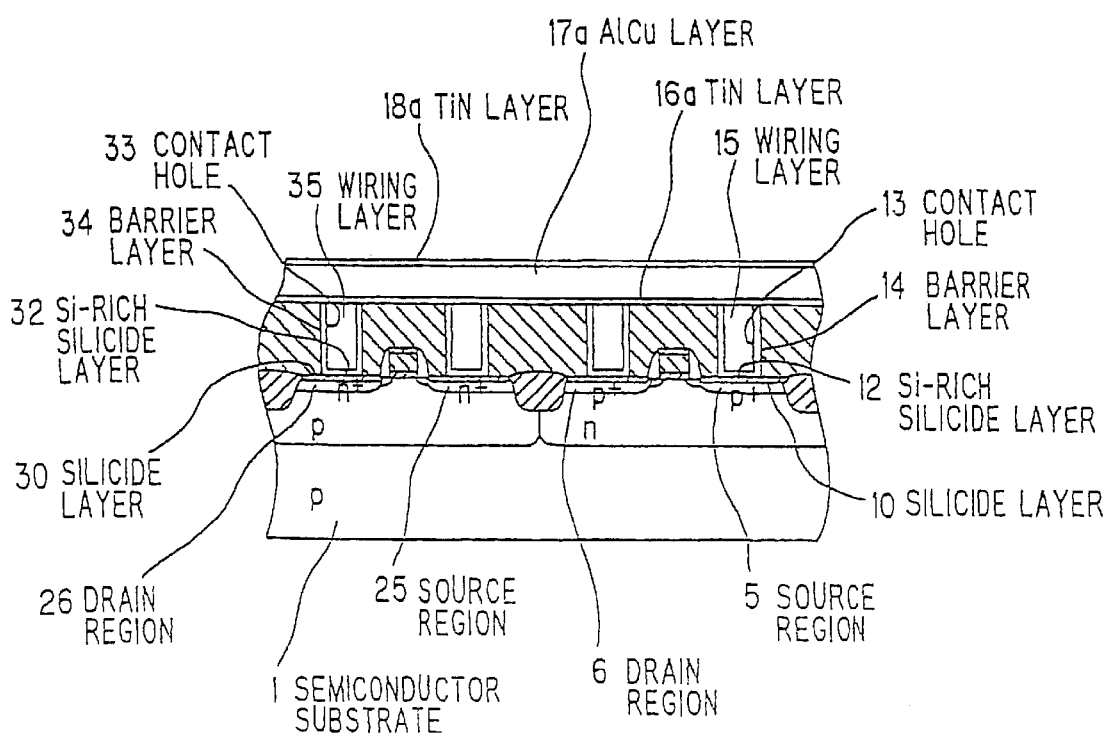

Then, as shown in FIG. 16, the wiring layers 15, 35 of tungsten are formed in the contact holes 13, 33 to connect with the barrier layers 14, 34. In detail, first, by CVD using tungsten hexafluoride (WF6) as an impurity source, at a substrate temperature of 400 to 500° C., tungsten is formed on the barrier layers 14, 34 including the contact holes 13, 33. Then, by CMP (chemical mechanical polishing), the barrier layers 14, 34 and tungsten on the interlayer dielectric film 20 are removed thereby flattening the surface. Thereby, the wiring layers 15, 35, with tungsten only in the contact holes 13, 33, are formed.

Then, as shown in FIG. 16, the TiN layer 16a of about 50 nm thick, the AlCu layer 17a of 400 to 600 nm thick and the TiN layer 18a of 20 to 50 nm thick are sequentially formed on the entire surface of the interlayer dielectric film 20, by sputtering. Then, patterning by photolithography using reactive ion etching, the semiconductor device shown in FIG. 3 is obtained. Meanwhile, the TiN layer 18a is provided as an anti-reflective coating to prevent the precision of patterning from reducing due to the reflection of light on the AlCu layer 17a during the exposure in photolithography.

As described above, in this embodiment, in forming the p$^+$-type source region 5 and p$^+$-type drain region 6 of the p-channel type MOS transistor 2, and in forming the n$^+$-type source region 25 and n$^+$-type drain region 26 of the n-channel type MOS transistor 3, the silicide layers 10, 30 of Co—Si alloy layer are formed on the entire surface of the regions 5, 6, 25 and 26, then, in advance, ion-implanting to the entire surface of the silicide layers 10, 30, then forming the two-layer barrier layers 14, 34 of Ti/TiN followed by the annealing, thereby forming the Si-rich silicide layers 12, 32 while reacting Si with the Co—Si alloy layer and Ti. Thus, the semiconductor device in the first embodiment can be made by such a simple method. Namely, this method is performed adding only the process of ion-implanting Si in FIG. 14 to the conventionally-conducted process, without requiring another process. Therefore, the manufacturing process can be simplified.

Embodiment 3

Figure 17:
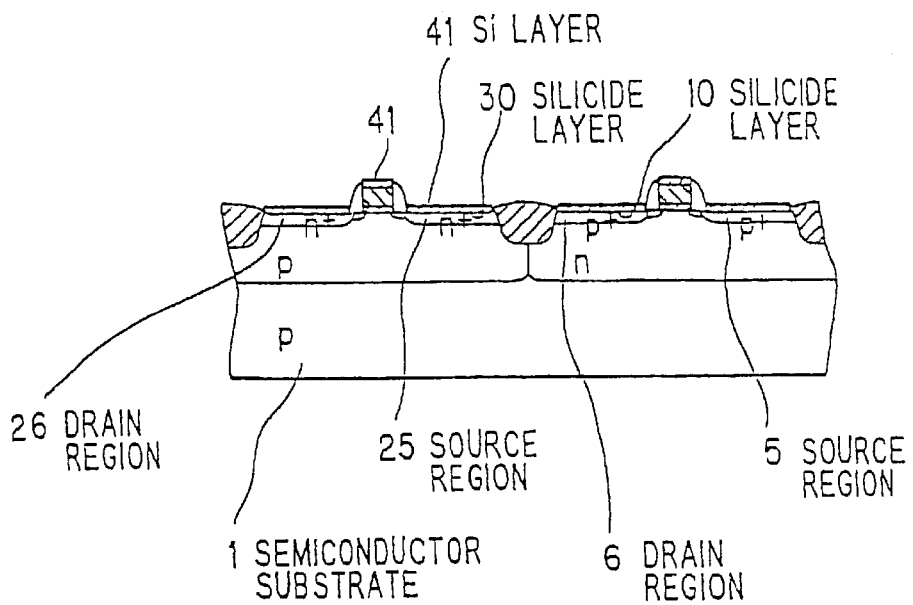
FIG. 17 is a cross sectional view showing a method for making a semiconductor device in a third preferred embodiment according to the invention.

FIG. 17 is a cross sectional view showing a method for making a semiconductor device in the third preferred embodiment of the invention.

The big difference of the composition of the method for making a semiconductor device in the third embodiment from that in the second embodiment is that the epitaxial selective growth of Si is conducted, instead of the entire-surface ion-implantation of Si shown in FIG. 14.

Namely, as shown in FIG. 17, using $Si_2H_6$ as an impurity source, the epitaxial growth is conducted on the conditions of flow rate of 1 to 20 SCCM (standard cubic centimeter per minute), pressure of less than $1\times10^{-2}$ Torr, 600 to 750° C. and 1 to 60 min. Thereby, a Si layer 41 is selectively grown on the entire surface of the silicide layers 10, 30 of Co—Si alloy layer. Thereafter, by conducting processes similar to those shown in FIGS. 15 and 16, the semiconductor device shown in FIG. 3 is obtained. Meanwhile, except this difference, this embodiment is similar to the second embodiment above-mentioned. Therefore, in FIG. 17, like parts are indicated by like reference numerals as used in the second embodiment and their explanations are omitted herein.

Thus, also in this embodiment, the same effect as that described in the second embodiment can be obtained.

Embodiment 4

Figure 18:
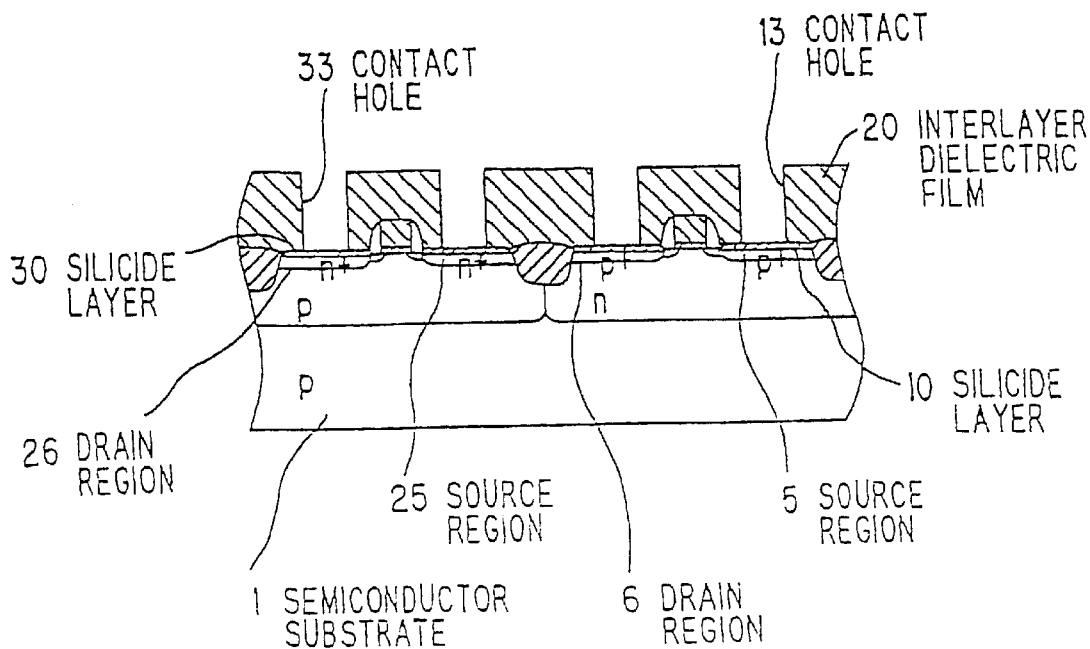
FIGS. 18 and 19 are cross sectional views showing a method for making a semiconductor device in a fourth preferred embodiment according to the invention.
Figure 19:
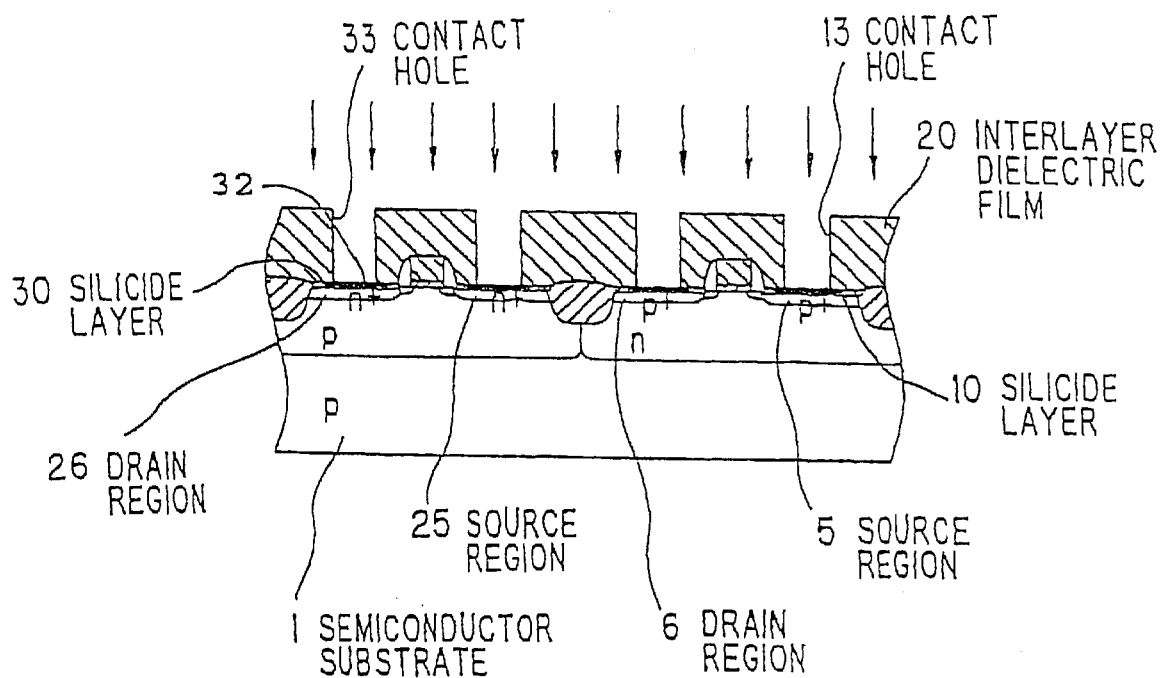

FIGS. 18 and 19 are cross sectional views showing a method for making a semiconductor device in the fourth preferred embodiment of the invention.

The big difference of the composition of the method for making a semiconductor device in the fourth embodiment from that in the second embodiment is that the partial ion-implantation of Si is conducted, instead of the entire-surface ion-implantation of Si shown in FIG. 14.

Namely, as shown in FIG. 18, the interlayer dielectric film 20 is formed on the entire surface of the semiconductor substrate 1, then removing part of the film by photolithography to expose part of the silicide layers 10, 30 to open the contact holes 13, 33.

Then, as shown in FIG. 19, Si is ion-implanted, as shown by arrows, into the semiconductor substrate 1 on the conditions of acceleration energy of 1 to 20 keV and dose amount of $1\times10^{14}$ to $7\times10^{15}$ cm$^{-2}$. Thereby, Si is implanted into part of the silicide layers 10, 30 through the contact holes 13, 33. Sequentially, by conducting the same processes as those shown in FIGS. 15 and 16, the semiconductor device shown in FIG. 3 is obtained.

Thus, also in this embodiment, the same effect as that described in the second embodiment can be obtained.

Beside, in this embodiment, the Si-rich silicide layers 12, 32 are selectively formed at the bottom of the contact holes 13, 33, and are made amorphous-like due to the etching in forming the contact holes 13, 33. Therefore, the formation of the silicide layers 12, 32 can be facilitated.

Embodiment 5

Figure 20:
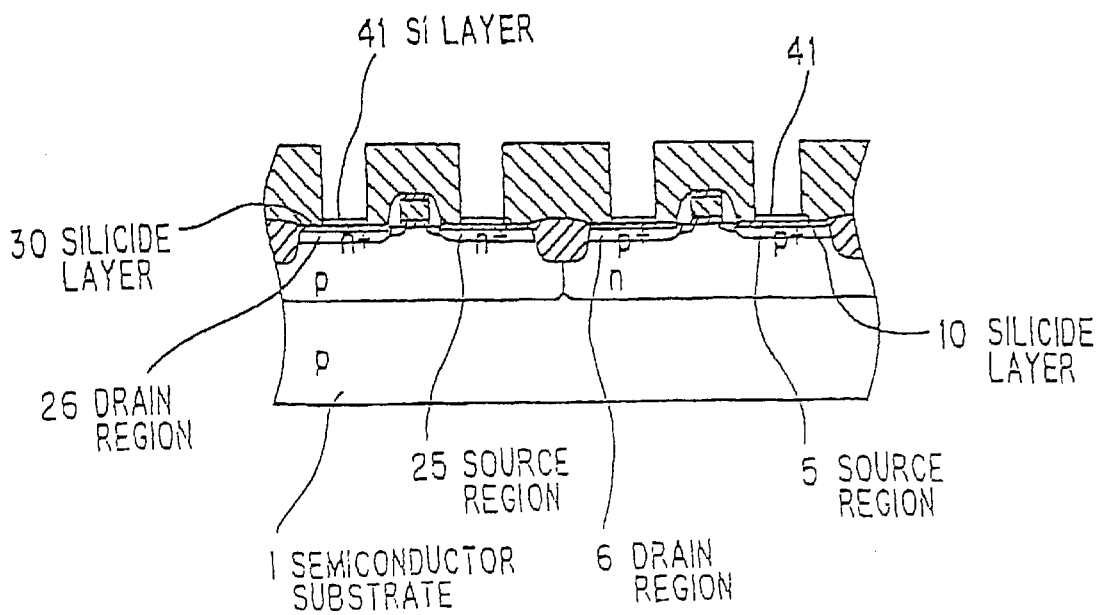
FIG. 20 is a cross sectional view showing a method for making a semiconductor device in a fifth preferred embodiment according to the invention.

FIG. 20 is a cross sectional view showing a method for making a semiconductor device in the fifth preferred embodiment of the invention.

The big difference of the composition of the method for making a semiconductor device in the fifth embodiment from that in the third embodiment is that the epitaxial selective growth of Si shown in FIG. 17 is conducted after forming the contact holes.

Namely, as shown in FIG. 18, the interlayer dielectric film 20 is formed on the entire surface of the semiconductor substrate 1 by CVD, and then the contact holes 13, 33 are formed. Then, as shown in FIG. 20, using $Si_2H_6$ as an impurity source, the epitaxial growth is conducted on the conditions of flow rate of 1 to 20 SCCM, pressure of less than $1\times10^2$ Torr, 600 to 750° C. and 1 to 60 min. Thereby, the Si layer 41 is selectively grown on part of the silicide layers 10, 30 of Co—Si alloy layer. Thereafter, by conducting the same processes as those shown in FIGS. 15 and 16, the semiconductor device shown in FIG. 3 is obtained.

Thus, also in this embodiment, the same effect as that described in the third and fourth embodiments can be obtained.

Embodiment 6

Figure 21:
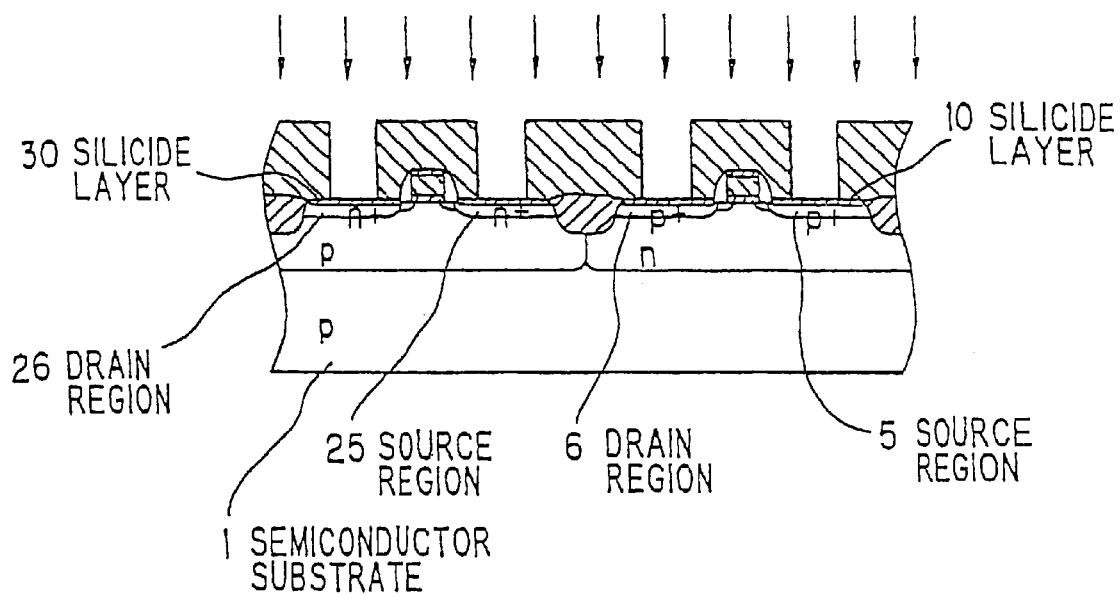
FIG. 21 is a cross sectional view showing a method for making a semiconductor device in a fifth preferred embodiment according to the invention.

FIG. 21 is a cross sectional view showing a method for making a semiconductor device in the sixth preferred embodiment of the invention.

The big difference of the composition of the method for making a semiconductor device in the sixth embodiment from that in the fourth embodiment is that the partial ion-implantation of Ti is conducted before conducting the partial ion-implantation of Si.

Namely, as shown in FIG. 18, the interlayer dielectric film 20 is formed on the entire surface of the semiconductor substrate 1, then opening the contact holes 13, 33. Then, as shown in FIG. 21, Ti is ion-implanted, as shown by arrows, into the semiconductor substrate 1 on the conditions of acceleration energy of 1 to 30 keV and dose amount of $1\times10^{14}$ to $1\times10^{15}$ cm$^{-2}$. Thereby, Ti is implanted into part of the silicide layers 10, 30 through the contact holes 13, 33. Since the surface of Co—Si alloy layer of the silicide layers 10, 30 is made amorphous-like due to the ion-implantation of Ti, the formation of the Si-rich silicide layers (Co—Si—Ti alloy layers) 12, 32 to follow this can be facilitated.

Sequentially, Si is ion-implanted, as shown by arrows, on the conditions of acceleration energy of 1 to 20 keV and dose amount of $5\times10^{14}$ to $7\times10^{15}$ cm$^{-2}$. Thereby, Si is implanted into part of the silicide layers 10, 30 through the contact holes 13, 33, like Ti. Thereafter, by conducting the same processes as those shown in FIGS. 15 and 16, the semiconductor device shown in FIG. 3 is obtained.

Thus, also in this embodiment, the same effect as that described in the fourth embodiment can be obtained.

Although the preferred embodiments of the invention have been detailed as above referring to the drawings, the concrete composition of this invention is not limited to these embodiments and this invention includes any alterations of designing in the scope of this invention. For example, the components of the Si-rich silicide layer, which is composed of Co—Si—Ti alloy layer, may be replaced with another component, e.g., tungsten, except Si. Also, tungsten, which is used as a wiring material, may be replaced with another material, e.g., Al-system metal. Also, the substrate is not limited to the semiconductor substrate.

Also, though, in the above embodiments, this invention is applied to the MOS type semiconductor device, this invention is not limited to this, and, if only using the silicide layer as the contact layer, may be applied to another semiconductor device, e.g., a bipolar type semiconductor device.

Also, in the sixth embodiment, the ion-implantation of Ti may be conducted after the ion-implantation of Si. Also, the conditions of the ion-implantation of various impurities and thermal treatment can be altered according to need.

Also, in the above embodiments, the Si-rich silicide layer is formed by ion-implanting Si into the contact hole with a diameter of about 0.2 µm at a dose amount of about $5\times10^{15}$ cm$^{-2}$. However, when, for the contact hole with a diameter of 0.1 to 0.2 µm, Si is ion-implanted at a dose amount of $2\times10^{15}$ cm$^{-2}$ to $8\times10^{15}$ cm$^{-2}$, similar effect to that described above can be obtained.

Although the invention has been described with respect to specific embodiment for complete and clear disclosure, the appended claims are not to be thus limited but are to be construed as embodying all modifications and alternative constructions that may be occurred to one skilled in the art which fairly fall within the basic teaching here is set forth.

What is claimed is:

1. A method for making a semiconductor device, comprising the steps of:

forming selectively a given conductive type semiconductor region on a substrate;

forming a Co—Si alloy layer on the entire surface of said semiconductor region;

introducing Si into the entire surface or part of said Co—Si alloy layer;

forming a Ti-included layer in part of said Co—Si alloy layer; and conducting a thermal treatment of said substrate to react the introduced Si with said Co—Si alloy layer and said Ti-included layer to form a Si-rich silicide layer including such a silicon amount that contact resistance is significantly lowered.

2. A method for making a semiconductor device, according to claim 1, wherein:

said Si introducing step is conducted using an ion implantation method or an epitaxial growth method.

3. A method for making a semiconductor device, according to claim 2, wherein:

said Si introducing step is conducted ion-implanting at a dose amount of $2\times10^{15}$ cm$^{-2}$ to $8\times10^{15}$ cm$^{-2}$.

4. A method for making a semiconductor device, according to claim 1, further comprising the step of:

introducing Ti into part of said Co—Si alloy layer before or after said Si introducing step.

5. A method for making a semiconductor device, according to claim 4, wherein:

said Ti introducing step is conducted using an ion implantation method.

* * * * *